(12) United States Patent
Kono et al.

(10) Patent No.: US 9,698,157 B2
(45) Date of Patent: Jul. 4, 2017

(54) MICROSTRUCTURE DEVICE AND METHOD FOR MANUFACTURING THE SAME

(71) Applicant: Kabushiki Kaisha Toshiba, Minato-ku (JP)

(72) Inventors: Yuko Kono, Shinagawa (JP); Takaki Hashimoto, Yokohama (JP); Yuji Setta, Kuwana (JP); Toshiya Kotani, Machida (JP); Chikaaki Kodama, Arakawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 7 days.

(21) Appl. No.: 14/834,552

(22) Filed: Aug. 25, 2015

(65) Prior Publication Data

US 2016/0268278 A1    Sep. 15, 2016

Related U.S. Application Data

(60) Provisional application No. 62/132,228, filed on Mar. 12, 2015.

(51) Int. Cl.
*H01L 21/44* (2006.01)
*H01L 27/11582* (2017.01)
(Continued)

(52) U.S. Cl.
CPC .... *H01L 27/11582* (2013.01); *H01L 27/1157* (2013.01); *H01L 27/11575* (2013.01)

(58) Field of Classification Search
CPC ......... H01L 27/11565; H01L 27/11573; H01L 27/11575; H01L 29/7926; H01L 27/11582; H01L 29/792; H01L 21/336
See application file for complete search history.

(56) References Cited

U.S. PATENT DOCUMENTS

| | | |
|---|---|---|
| 8,092,960 B2 | 1/2012 | Ozawa |
| 2005/0130045 A1 | 6/2005 | Ozawa |
| (Continued) | | |

FOREIGN PATENT DOCUMENTS

| | | |
|---|---|---|
| JP | 10-242168 | 9/1998 |
| JP | 2002-311565 | 10/2002 |
| JP | 2009-91855 | 4/2009 |

OTHER PUBLICATIONS

Lance Mosher et al., "Double-Exposure Grayscale Photolithography", Journal of Microelectromechanical systems, vol. 18, No. 2, Apr. 2009, 8 pages.

*Primary Examiner* — Charles Garber
*Assistant Examiner* — Abdulfattah Mustapha
(74) *Attorney, Agent, or Firm* — Oblon, McClelland, Maier & Neustadt, L.L.P.

(57) ABSTRACT

A microstructure body according to an embodiment includes a stacked body. The stacked body includes a plurality of unit structure bodies stacked periodically along a first direction. A configuration of an end portion of the stacked body in a second direction is a stairstep configuration including terraces formed every unit structure body. The second direction intersects the first direction. A first distance in a third direction between end edges of two of the unit structure bodies facing the third direction is shorter than a second distance in the second direction between end edges of the two of the unit structure bodies facing the second direction. The third direction intersects both the first direction and the second direction.

20 Claims, 10 Drawing Sheets (51) Int. Cl.
*H01L 27/1157* (2017.01)
*H01L 27/11575* (2017.01)

(56) References Cited

U.S. PATENT DOCUMENTS

| | | | |
|---|---|---|---|
| 2009/0044166 A1 | 2/2009 | Ozawa | |
| 2012/0132983 A1 | 5/2012 | Fukuzumi | |
| 2012/0149203 A1* | 6/2012 | Fu | H01L 21/32139 |
| | | | 438/696 |
| 2016/0148835 A1* | 5/2016 | Shimabukuro | H01L 21/76802 |
| | | | 257/314 |

* cited by examiner

POSITION (L-DIRECTION)

MICROSTRUCTURE DEVICE AND METHOD FOR MANUFACTURING THE SAME

CROSS-REFERENCE TO RELATED APPLICATIONS

This application is based upon and claims the benefit of priority from U.S. Provisional Patent Application 62/132,228, filed on Mar. 12, 2015; the entire contents of which are incorporated herein by reference.

FIELD

Embodiments described herein relate to a microstructure device and a method for manufacturing the same.

BACKGROUND

Conventionally, the bit cost of NAND flash memory has been reduced by increasing the bit density by shrinking the planar structure; but the shrinking of the planar structure is approaching a limit. Therefore, in recent years, technology has been proposed in which memory cells are stacked in a vertical direction. However, there is a tendency for the manufacturing processes to become complex for such a stacked semiconductor memory device.

BRIEF DESCRIPTION OF THE DRAWINGS

FIG. 5A to FIG. 7C are cross-sectional views showing the method for manufacturing the semiconductor memory device according to the embodiment;

DETAILED DESCRIPTION

A microstructure body according to an embodiment includes a stacked body. The stacked body includes a plurality of unit structure bodies stacked periodically along a first direction. A configuration of an end portion of the stacked body in a second direction is a stairstep configuration including terraces formed every unit structure body. The second direction intersects the first direction. A first distance in a third direction between end edges of two of the unit structure bodies facing the third direction is shorter than a second distance in the second direction between end edges of the two of the unit structure bodies facing the second direction. The third direction intersects both the first direction and the second direction.

A method for manufacturing a microstructure body according to an embodiment includes forming a resist film on a stacked body. The stacked body includes a plurality of unit structure bodies stacked periodically along a first direction. The method includes exposing the resist film using an exposure mask. A plurality of terrace regions arranged along one direction are set in the exposure mask. A first region and a second region arranged along the one direction are set in each of the terrace regions. A light-shielding portion and a transparent portion are arranged at a first period in the first region. The light-shielding portion and the transparent portion are arranged at a second period in the second region. The second period is longer than the first period. A surface area ratio of the light-shielding portion and the transparent portion in the first region of the plurality of terrace regions changes in steps according to an arrangement order of the terrace regions. The method includes forming a resist mask by developing the resist film after the exposing. The method includes patterning the stacked body by etching using the resist mask as a mask.

Embodiment

An embodiment of the invention will now be described with reference to the drawings.

The microstructure body according to the embodiment is a stacked semiconductor memory device.

Figure 1A:
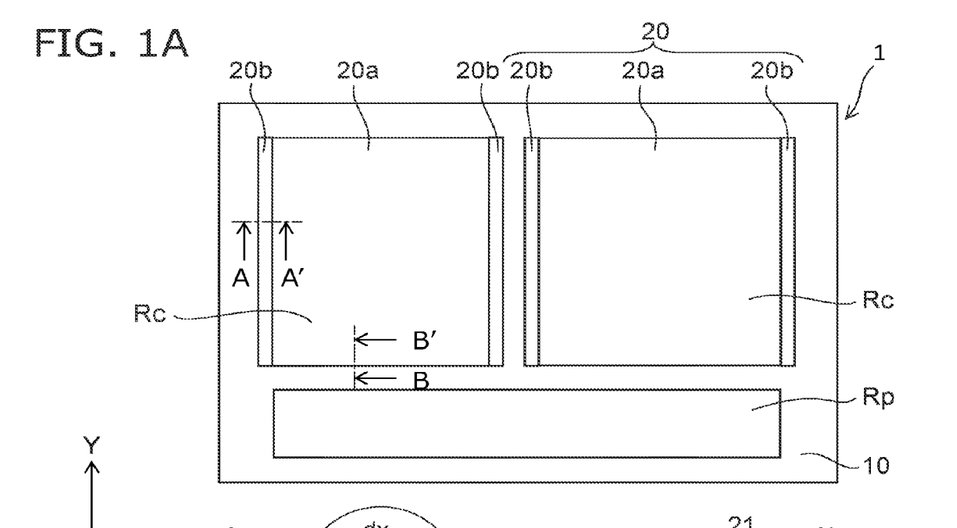
FIG. 1A is a plan view showing a semiconductor memory device according to an embodiment.
Figure 1B:
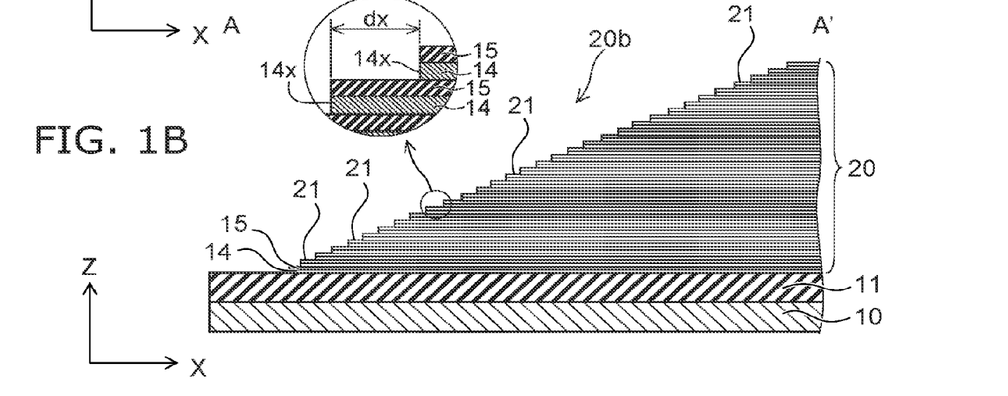
FIG. 1B is a cross-sectional view along line A-A' shown in FIG. 1A.
Figure 1C:
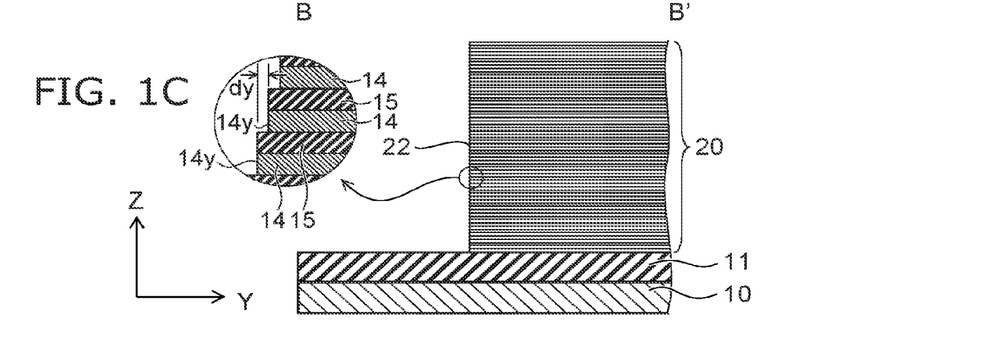
FIG. 1C is a cross-sectional view along line B-B' shown in FIG. 1A.

FIG. 1A is a plan view showing the semiconductor memory device according to the embodiment; FIG. 1B is a cross-sectional view along line A-A' shown in FIG. 1A; and FIG. 1C is a cross-sectional view along line B-B' shown in FIG. 1A. In FIG. 1B and FIG. 1C, enlarged views of portions are shown in the circles.

Figure 2:
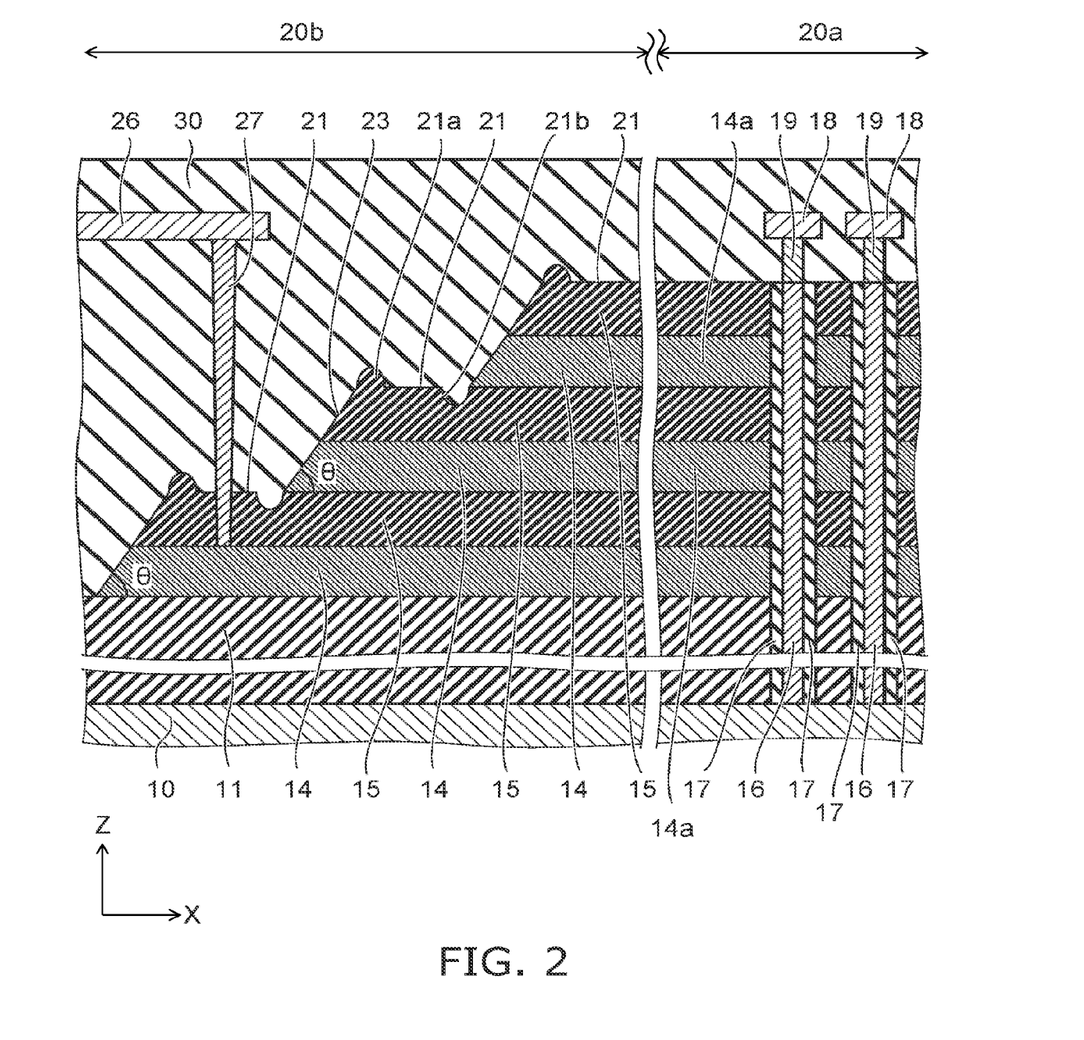
FIG. 2 is a cross-sectional view showing the semiconductor memory device according to the embodiment.

FIG. 2 is a cross-sectional view showing the semiconductor memory device according to the embodiment.

As shown in FIG. 1A to FIG. 1C and FIG. 2, a silicon substrate 10 is provided in the semiconductor memory device 1 according to the embodiment. Hereinbelow, an XYZ orthogonal coordinate system is employed in the specification for convenience of description. Two mutually-orthogonal directions parallel to the upper surface of the silicon substrate 10 are taken as an "X-direction" and a "Y-direction;" and a direction orthogonal to the upper surface of the silicon substrate 10 is taken as a "Z-direction."

A memory cell region Rc and a peripheral circuit region Rp are set in the silicon substrate 10. In the memory cell region Rc, multiple memory cells are arranged three-dimensionally. In the peripheral circuit region Rp, a peripheral circuit for driving the memory cells is formed.

In the memory cell region Rc, an insulating film 11 is formed on the silicon substrate 10. A stacked body 20 is formed on the insulating film 11 by stacking conductive films 14 and insulating films 15 alternately along the Z-direction. A unit structure body includes one conductive film 14 and one insulating film 15. For example, the conductive films 14 are formed of a conductive material such as polysilicon, etc.; and, for example, the insulating films 15 are formed of an insulating material such as silicon oxide, etc. Each of the conductive films 14 is divided into multiple word lines 14a extending in the X-direction.

A silicon pillar 16 that extends in the Z-direction is provided in an X-direction central portion 20a of the stacked body 20 and pierces the stacked body 20. A memory film 17 is provided around the silicon pillar 16. Accordingly, a portion of the memory film 17 is disposed between the silicon pillar 16 and the word line 14a. The memory film 17 is a film that can store charge. For example, a tunneling insulating film, a charge storage film, and a blocking insulating film are stacked in the memory film 17 in this order from the silicon pillar 16 side. A bit line 18 that extends in the Y-direction is provided on the X-direction central portion 20a of the stacked body 20. The upper end of the silicon pillar 16 is connected to the bit line 18 via a plug 19. Also, the lower end of the silicon pillar 16 is connected to the silicon substrate 10.

The configurations of two end portions 20b of the stacked body 20 in the X-direction are stairstep configurations in which terraces 21 are formed every unit structure body made of one conductive film 14 and one insulating film 15. "Terrace" refers to a portion of the stacked body 20 other than the uppermost level having an exposed upper surface and an exposed side surface due to portions of higher levels and portions to the side not existing. In other words, at the side surfaces of the stacked body 20 facing the X-direction, the terrace 21 that is relatively nearly a horizontal plane (the XY plane) and a ramp 23 that is relatively nearly a perpendicular plane (the YZ plane) are arranged alternately along the Z-direction. An angle θ between the ramp 23 and the upper surface of the terrace 21 is 45 degrees or more. The insulating film 15 is exposed at the upper surface of each of the terraces 21. The conductive film 14 may be exposed at the upper surface of each of the terraces 21.

Also, a protrusion 21a is formed at the tip portion, i.e., the end portion on the side of the terrace 21 one level below, of each of the terraces 21. On the other hand, a recess 21b is made at the base portion, i.e., the end portion on the side of the terrace 21 one level above, of each of the terraces 21.

An inter-layer insulating film 30 is provided on the silicon substrate 10 to cover the stacked body 20. A word line draw-out interconnect 26 that extends in the X-direction and a contact 27 that extends in the Z-direction are provided inside the inter-layer insulating film 30 in a region directly above the end portion 20b. The lower end of the contact 27 is connected to the conductive film 14 of the terrace 21. The upper end of the contact 27 is connected to the word line draw-out interconnect 26. The word line draw-out interconnect 26 and the contact 27 are provided every terrace 21.

On the other hand, terraces are not formed at the two end portions of the stacked body 20 in the Y-direction; and the two end portions of the stacked body 20 in the Y-direction are terminated by side surfaces 22 that are substantially perpendicular to the XZ plane. The side surface 22 may be tilted at an angle less than 90 degrees with respect to the upper surface of the silicon substrate 10 and may be formed into a terrace every one or more unit structure bodies. However, in such a case as well, for two conductive films 14 separated in the Z-direction, the distance in the Y-direction between the end edges on the Y-direction side is shorter than the distance in the X-direction between the end edges on the X-direction side. In other words, the side surface 22 as an entirety is steeper than the stairsteps of the portion 20b.

In other words, Formula 1 recited below holds, where dx is the distance between end edges 14x facing the X-direction of two conductive films 14 adjacent to each other in the Z-direction as shown in FIG. 1B, and dy is the distance between end edges 14y facing the Y-direction of the two conductive films 14 as shown in FIG. 1C. In the case where the end surfaces of the conductive films 14 are tilted, the end edges 14x and 14y are lower ends of the end surfaces.

$$dx > dy \quad \text{(Formula 1)}$$

In the case where the side surface 22 of the stacked body 20 facing the Y-direction is a perpendicular plane, dy=0. Although it is favorable for the distance dy to be small to downsize the semiconductor memory device 1, there are also cases where the side surface 22 is not a perfectly perpendicular plane due to the conditions of the etching (referring to FIG. 5A to FIG. 7C) for patterning the stacked body 20. Even in such a case, it is favorable for the distance dy described above to be not more than ½ times the distance dx, and more favorably not more than ¹⁄₁₀ times.

A method for manufacturing the semiconductor memory device according to the embodiment will now be described.

First, the exposure mask used in the embodiment will be described.

Figure 3A:
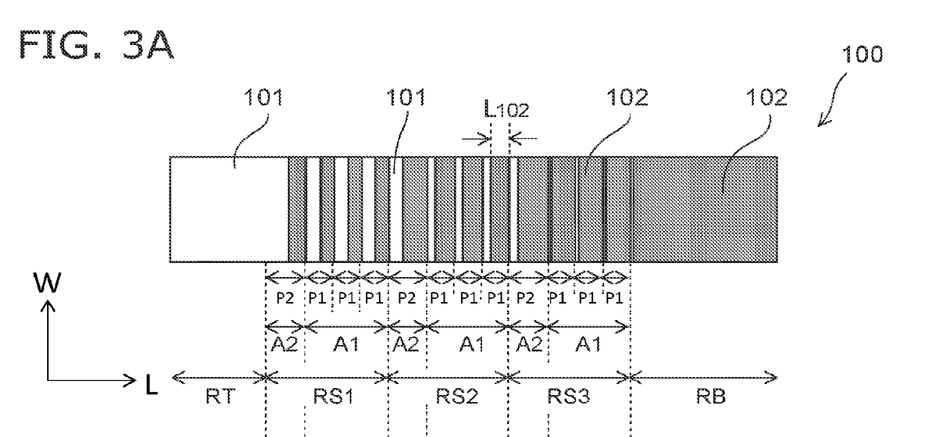
FIG. 3A is a plan view showing an exposure mask of the embodiment.
Figure 3B:
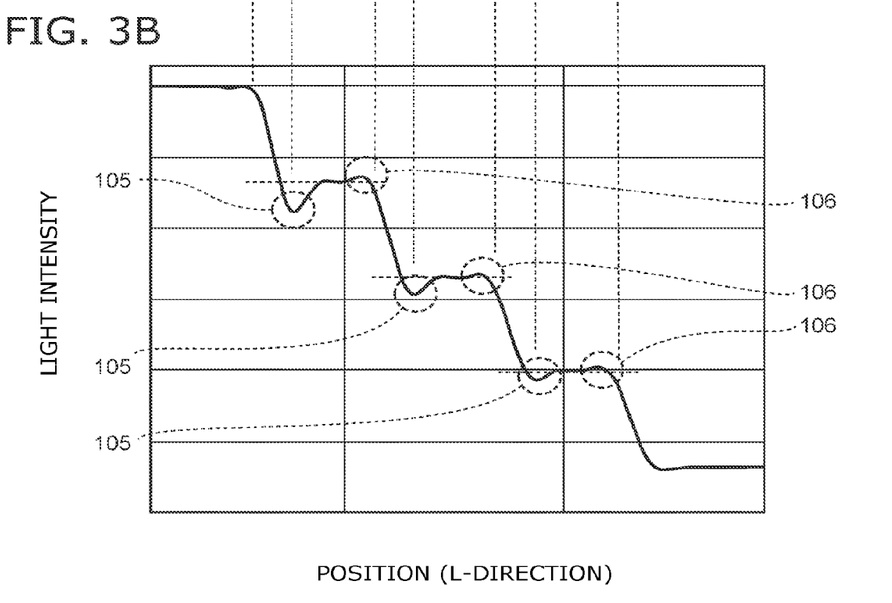
FIG. 3B is a graph showing simulation results of the intensity distribution of light passing through the exposure mask shown in FIG. 3A, where the horizontal axis is the position, and the vertical axis is the intensity of the light.

FIG. 3A is a plan view showing the exposure mask of the embodiment; and FIG. 3B is a graph showing simulation results of the intensity distribution of light passing through the exposure mask shown in FIG. 3A, where the horizontal axis is the position, and the vertical axis is the intensity of the light.

As shown in FIG. 3A, a transparent portion 101 that transmits the greater part or all of the light, and a light-shielding portion 102 that shields the greater part or all of the light are provided in an exposure mask 100. In an example, the transparent portion 101 transmits substantially all of the light. Also, the light-shielding portion 102 shields 94% of the light and transmits 6% of the light.

On the other hand, a transparent region RT and a light-shielding region RB are provided in the exposure mask 100, where the entire transparent region RT is made of the transparent portion 101, and the entire light-shielding region RB is made of the light-shielding portion 102. Also, multiple terrace regions RS1 to RS3 (hereinbelow, generally called the "terrace regions RS") are arranged in one column between the transparent region RT and the light-shielding region RB. Hereinbelow, the arrangement direction is called the "L-direction;" and a direction orthogonal to the L-direction is called the "W-direction." The number of terrace regions of the exposure mask 100 is set to be the same as the number of levels of the terraces 21 of the stacked body 20 to be formed. In FIG. 3A, only the three terrace regions RS1 to RS3 are shown for convenience of illustration.

On the other hand, light-shielding regions RB (not shown) which are completely made of the light-shielding portion 102 are provided at the two W-direction end portions of the exposure mask 100. In the W-direction, the transparent region RT and the light-shielding region RB contact each other; and the terrace region RS is not disposed between the two regions.

A region A1 and a region A2 are provided in each of the terrace regions RS. Inside each of the terrace regions RS, the region A1 is disposed on the light-shielding region RB side; and the region A2 is disposed on the transparent region RT side. The region A2 is shorter than the region A1 in the arrangement direction (the L-direction) of the terrace regions RS.

In the region A1, the transparent portion 101 and the light-shielding portion 102 are arranged alternately at a period P1 along the L-direction. The transparent portion 101 and the light-shielding portion 102 are disposed in a line-and-space configuration extending in the W-direction. The period P1 is 1/n times the length of the region A1 in the L-direction, where n is an integer not less than 1. Accordingly, the transparent portions 101 and the light-shielding portions 102 are provided in n locations each in each of the regions A1. In the example shown in FIG. 3A, n is 3. The period P1 is shorter than the resolution limit of the exposure described below. In other words, the pattern of the region A1 is not resolved on the resist film. The exposure limit of some optical system is expressed by Formula 2 recited below, where $P_{min}$ is the exposure limit, λ, is the wavelength of the light, NA is the numerical aperture, and σ is the radius (the coherence factor) of the illumination.

$$P_{min} = \frac{\lambda}{NA \times (1 + \sigma)} \quad \text{(Formula 2)}$$

The value ($L_{102}$/P1) of the ratio of a length $L_{102}$ to the period P1 is taken as a duty ratio D, where $L_{102}$ is the length in the L-direction of one light-shielding portion 102. The duty ratio D of the transparent region RT is 0. Also, the duty ratio D of the light-shielding region RB is 1. Also, the duty ratio D of the region A1 of the terrace region RS has values between 0 and 1 and changes in steps according to the arrangement order of the terrace regions RS. In other words, the duty ratio D of the terrace region RS2 is higher than the duty ratio D of the terrace region RS1; and the duty ratio D of the terrace region RS3 is higher than the duty ratio D of the terrace region RS2. Generally, an effective transmittance T of the light of a pattern in which the arrangement period is less than the resolution limit is expressed by Formula 3 recited below. According to Formula 3 recited below, T=1 when D=0, and T=0 when D=1.

$$T = (1-D)^2 \quad \text{(Formula 3)}$$

On the other hand, in the region A2, the transparent portion 101 and the light-shielding portion 102 are arranged one location each along the L-direction. The arrangement period is a period P2. In such a case, the period P2 corresponds to the total value of the length of one transparent portion 101 and the length of one light-shielding portion 102 in the L-direction. The period P2 is longer than the period P1 and slightly longer than the resolution limit of the exposure. Accordingly, the pattern of the region A2 is somewhat resolved on the resist film. The transparent portion 101 and the light-shielding portion 102 may be arranged in multiple locations each in the region A2. Also, the period P2 may be different between the regions A2.

When performing the exposure using the exposure mask 100 shown in FIG. 3A, the intensity distribution of the light at the imaging plane is as shown in FIG. 3B. In other words, at the imaging plane, the intensity of the light is highest in the region corresponding to the transparent region RT and lowest in the region corresponding to the light-shielding region RB; and summarily speaking, a difference in levels is formed every terrace region RS.

In the region corresponding to each of the terrace regions RS, the intensity distribution of the light in the region A1 is substantially uniform; and the intensity distribution of the light in the region A2 monotonously changes relatively steeply. The intensity of the light at the vicinity of the boundary between the region A1 and the region A2 in the same terrace region RS is slightly lower than the intensity of the light in the region A1; and a minimum portion 105 is formed in the intensity distribution. On the other hand, the intensity of the light at the vicinity of the boundary between the mutually-adjacent terrace regions RS is slightly higher than the surroundings; and a maximum portion 106 is formed in the intensity distribution.

The method for manufacturing the semiconductor memory device using the exposure mask 100 described above will now be described.

Figure 4:
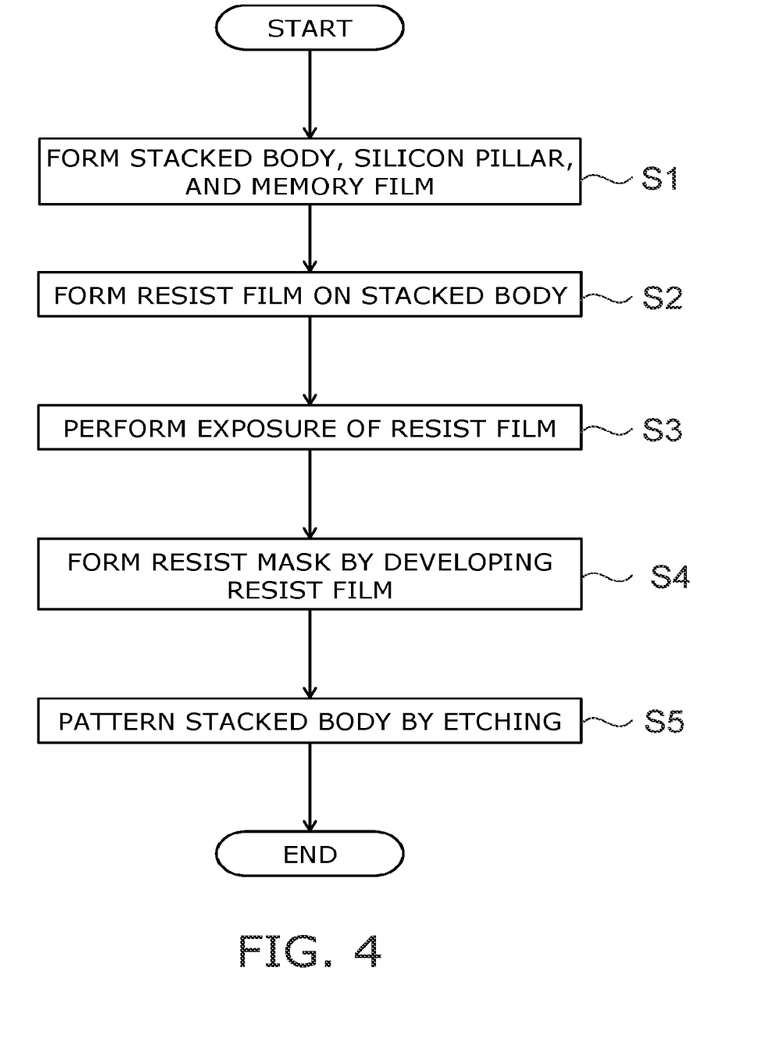
FIG. 4 is a flowchart showing a method for manufacturing the semiconductor memory device according to the embodiment.

FIG. 4 is a flowchart showing the method for manufacturing the semiconductor memory device according to the embodiment.

FIG. 5A to FIG. 7C are cross-sectional views showing the method for manufacturing the semiconductor memory device according to the embodiment.

Figure 8:
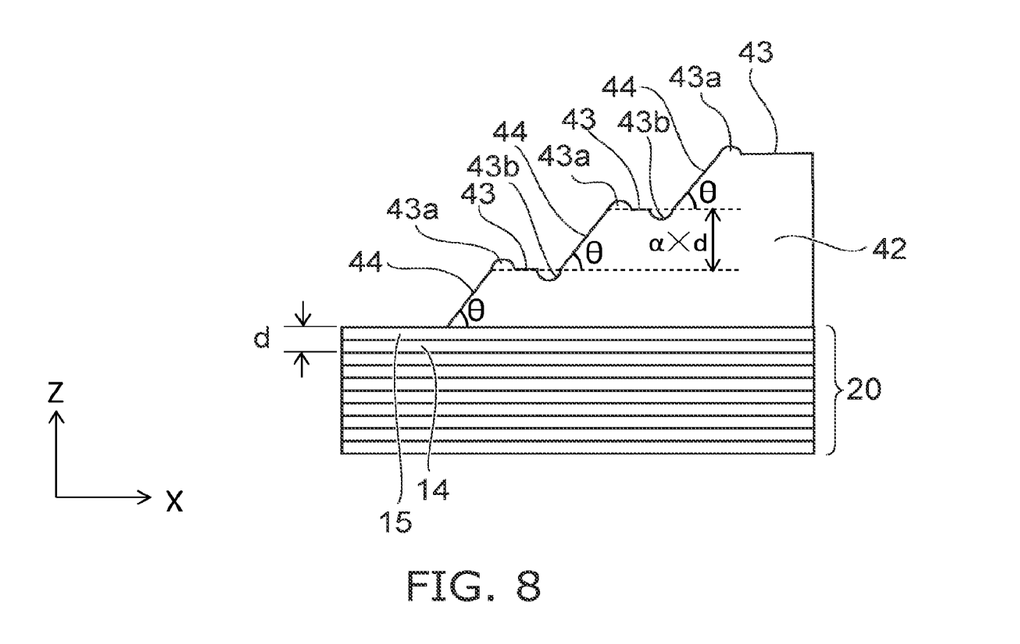
FIG. 8 is a cross-sectional view showing a resist mask formed in the embodiment.

FIG. 8 is a cross-sectional view showing a resist mask formed in the embodiment.

First, as shown in FIG. 2 and step S1 of FIG. 4, the stacked body 20, the silicon pillars 16, and the memory films 17 are formed on the silicon substrate 10. Specifically, the insulating film 11 is formed on the silicon substrate 10. Then, the peripheral circuit (not shown) is formed in the peripheral circuit region Rp of the silicon substrate 10. Then, the stacked body 20 is formed on the entire surface by alternately depositing the conductive films 14 and the insulating films 15.

Then, memory holes that extend in the Z-direction, pierce the stacked body 20 and the insulating film 11, and reach the silicon substrate 10 are made in the central portion 20a of the stacked body 20. Then, the memory films 17 are formed on the inner surfaces of the memory holes; and the silicon pillars 16 are formed inside the memory holes. The lower ends of the silicon pillars 16 are connected to the silicon substrate 10. On the other hand, slits (not shown) that extend in the X-direction are made in portions of the stacked body 20 between the memory holes. Thereby, the conductive films 14 are divided every column of the memory holes arranged in one column along the X-direction to form the word lines 14a. Then, an insulating material is filled into the slits.

Figure 5A:
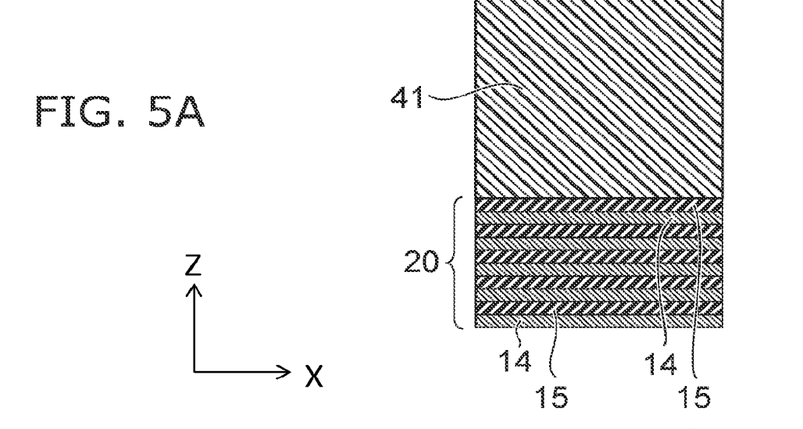

Then, as shown in FIG. 5A and step S2 of FIG. 4, a positive-type resist film 41 is formed on the stacked body 20. In the case where a negative-type resist is used, it is sufficient to interchange the transparent portion 101 and the light-shielding portion 102 of the exposure mask 100.

Then, as shown in step S3 of FIG. 4, exposure of the resist film 41 (referring to FIG. 5A) is performed using the exposure mask 100 shown in FIG. 3A. At this time, the intensity distribution of the light on the upper surface of the resist film 41 is as shown in FIG. 3B. Also, in the optical system of the exposure, the L-direction of the exposure mask 100 corresponds to the X-direction of the stacked body 20; and the W-direction corresponds to the Y-direction.

Figure 5B:
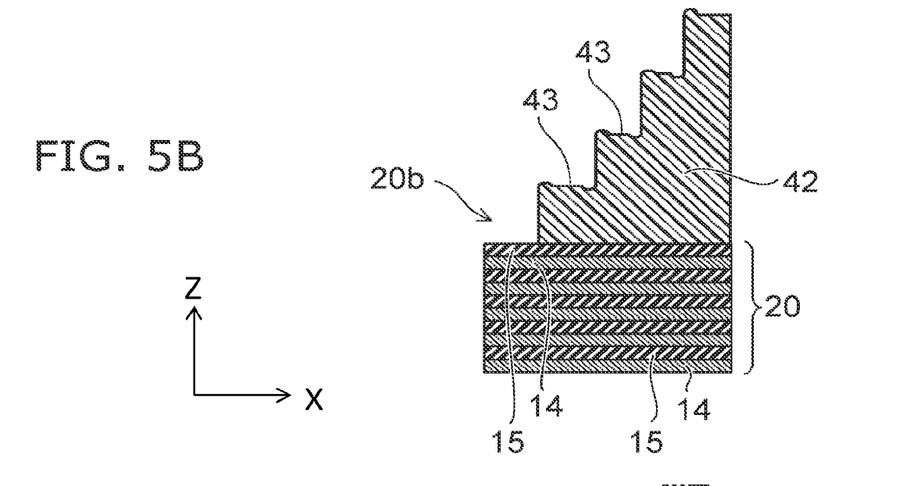

Then, as shown in step S4 of FIG. 4, the resist film 41 after the exposure is developed. Because the resist film 41 is the positive type, the dissolving progresses more for portions having higher exposure amounts. In other words, in FIG. 3B, the resist film 41 is dissolved more on the left side of the illustration; and the resist film 41 remains more on the right side of the illustration. As a result, as shown in FIG. 5B and FIG. 8, the resist film 41 is selectively removed; and a resist mask 42 that has a configuration reflecting the intensity distribution of the exposure light (referring to FIG. 3B) is formed.

As shown in FIG. 8, a terrace 43 that corresponds to the region A1 of the terrace region RS of the exposure mask 100 (referring to FIG. 3A) is formed in the resist mask 42; and the configuration of the resist mask 42 as an entirety is a stairstep configuration. A ramp 44 that corresponds to the region A2 is formed between the mutually-adjacent terraces 43. The angle θ between the ramp 44 and the upper surface of the terrace 43 is 45 degrees or more. It is favorable for the angle θ to be large, and most favorably, 90 degrees. A protrusion 43a is formed at the tip portion of each of the terraces 43; and a recess 43b is made at the base portion of each of the terraces 43. In FIG. 5B to FIG. 7C, the ramp 44 is drawn as a perpendicular plane.

Also, the height of each level of the resist mask 42, i.e., the distance in the Z-direction between the mutually-adjacent terraces 43, is set to α times the total value d of the film thickness of one conductive film 14 and the film thickness of one insulating film 15 (α×d) when the etching rate of the resist film 41 is α times the etching rate of the stacked body 20 in the etching (step S5) described below.

Figure 5C:
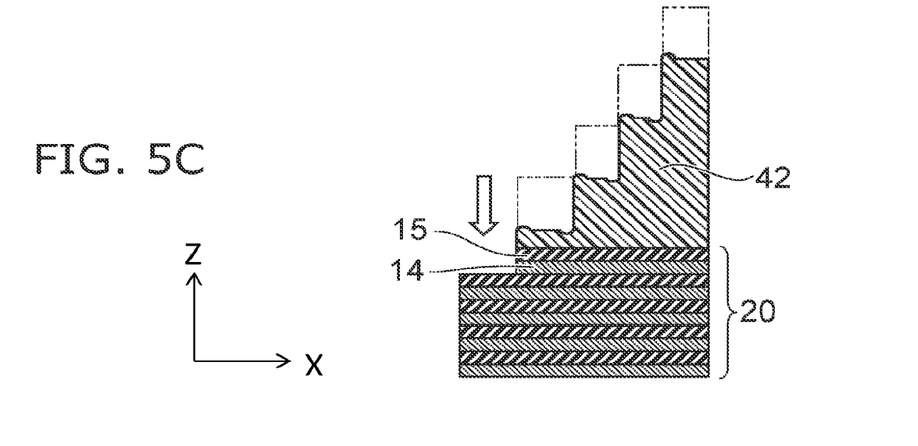
Figure 6A:
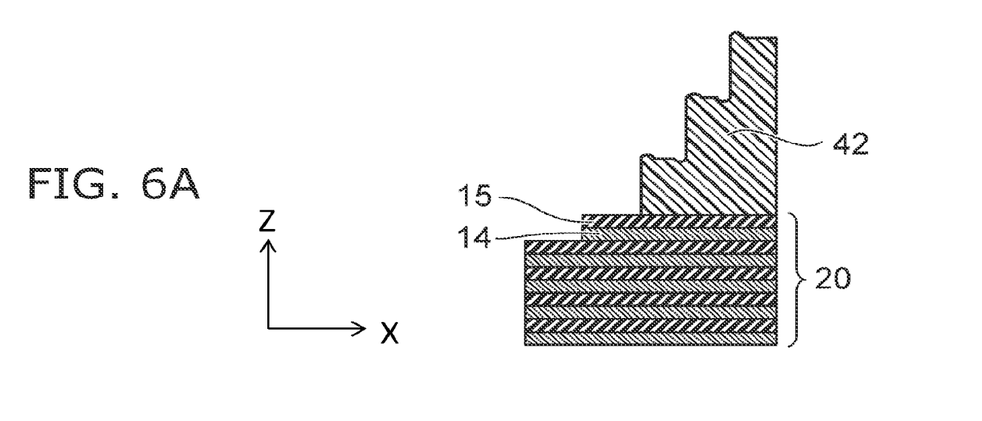
Figure 6B:
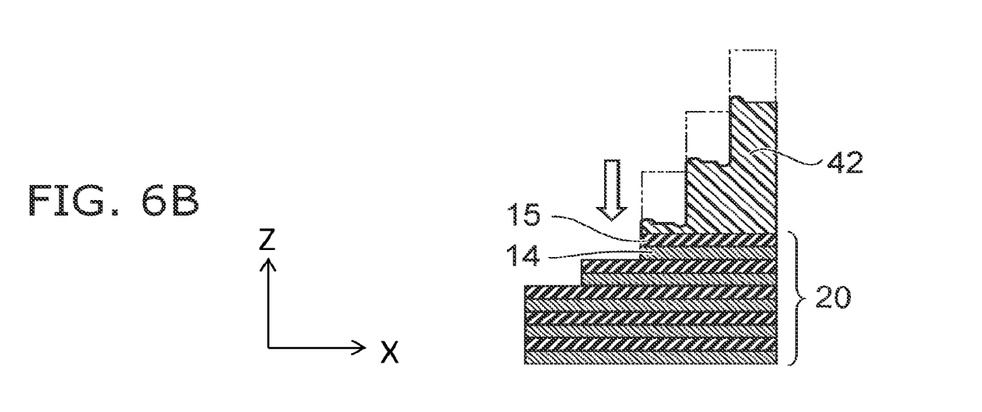
Figure 6C:
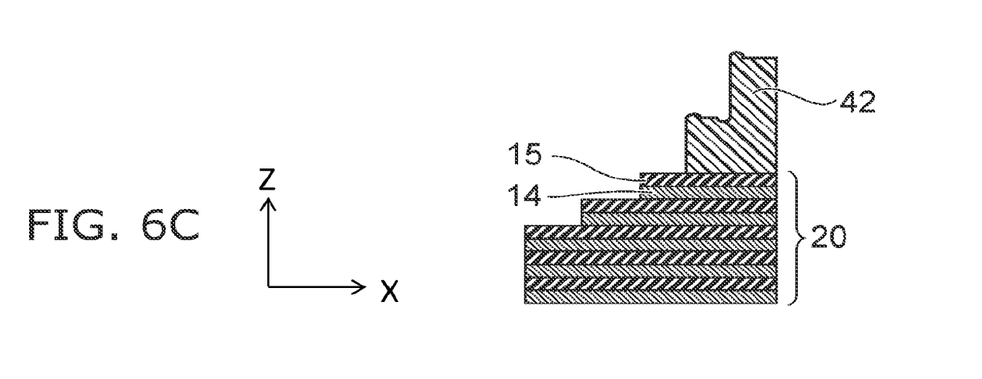
Figure 7A:
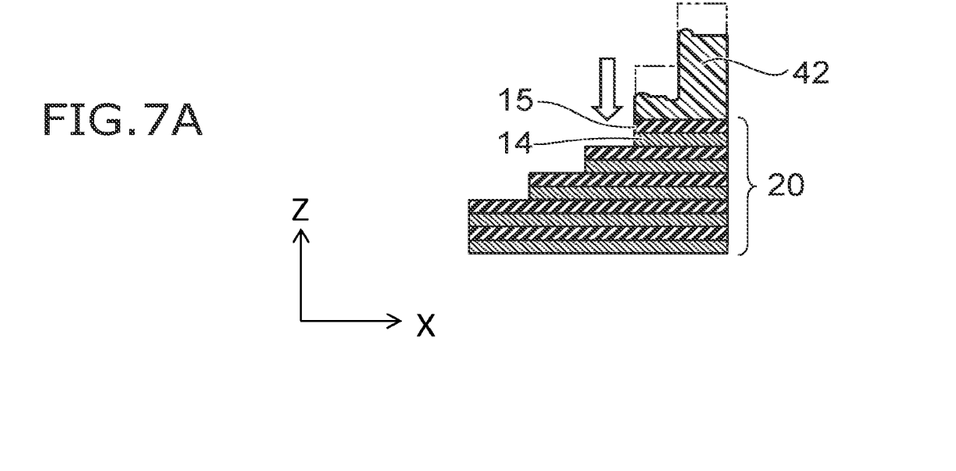
Figure 7B:
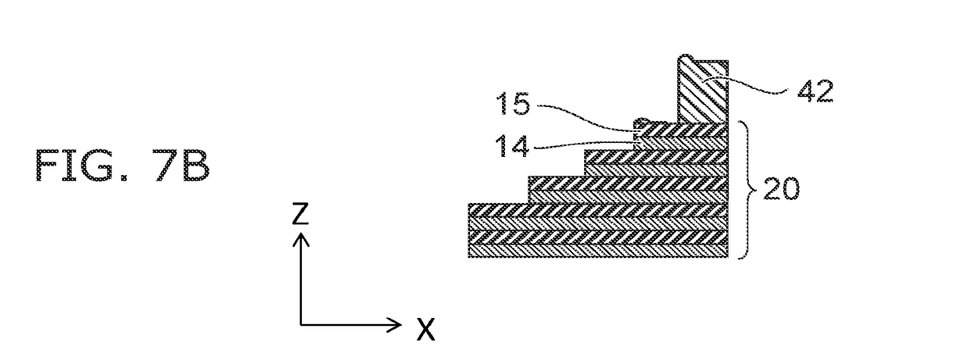
Figure 7C:
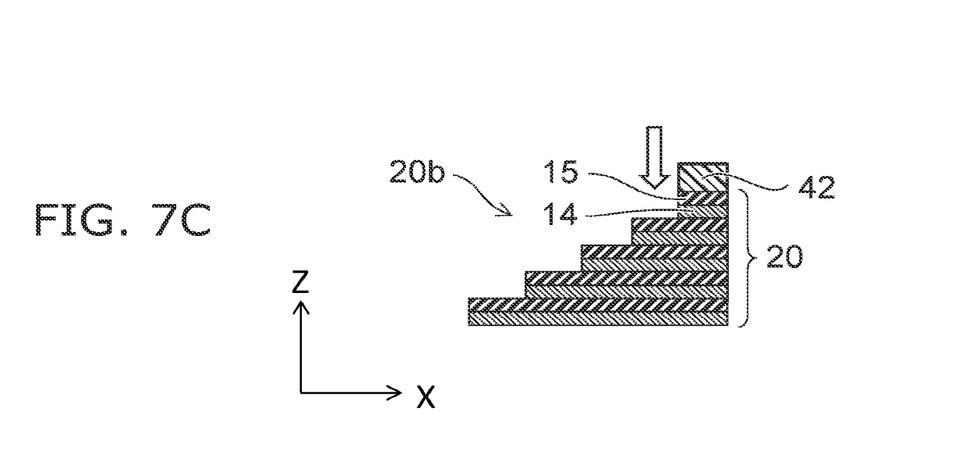

Then, as shown in step S5 of FIG. 4, anisotropic etching such as RIE (Reactive Ion Etching), etc., of the stacked body 20 is performed using the resist mask 42 as a mask. Thereby, as shown in FIG. 5C, the resist mask 42 is removed uniformly from the upper surface side; and the portions of the stacked body 20 not covered with the resist mask 42 are removed uniformly from the upper surface side. At this time, because the height α×d of each level of the resist mask 42 is set to the product of the etching ratio α and the total thickness d of the conductive film 14 and the insulating film 15, one insulating film 15 and one conductive film 14 are removed while the thickness of the resist mask 42 decreases by the amount α×d. As a result, as shown in FIG. 6A, due to the etching, one terrace 43 of the resist mask 42 disappears; and one level of the terraces 21 is formed in the stacked body 20 by the insulating film 15 of the uppermost level and the conductive film 14 under the insulating film 15 of the uppermost level being removed at the portion of the stacked body 20 not covered with the resist mask 42. Also, a new region is exposed at the upper surface of the stacked body 20.

Thereafter, etching is performed continuously as shown in FIG. 6B to FIG. 7C. Thereby, one level of the terraces 21 is formed in the stacked body 20 every time one terrace 43 of the resist mask 42 disappears. As a result, the end portion 20b of the stacked body 20 is patterned into a stairstep configuration.

Then, as shown in FIG. 2, the inter-layer insulating film 30 is formed to cover the stacked body 20. Then, the contacts 27 are formed inside the inter-layer insulating film 30; and the lower ends of the contacts 27 are connected to the conductive films 14 for the uppermost level of each of the terraces 21. Also, the plugs 19 are formed in the regions directly above the silicon pillars 16. Then, the word line draw-out interconnects 26 that extend in the X-direction and the bit lines 18 that extend in the Y-direction are formed. The word line draw-out interconnects 26 are connected to the upper ends of the contacts 27; and the bit lines 18 are connected to the upper ends of the plugs 19. Thus, the semiconductor memory device 1 according to the embodiment is manufactured.

Effects of the embodiment will now be described.

In the embodiment as shown in FIG. 5B and FIG. 8, the resist mask 42 that has the stairstep configuration is formed on the stacked body 20. Then, by performing anisotropic etching using the resist mask 42, the end portion 20b of the stacked body 20 can be patterned into a stairstep configuration by etching once. As a result, compared to the method for patterning the stacked body into the stairstep configuration by repeatedly performing slimming and etching of the resist film alternately, the number of processes is reduced drastically and the efficiency of the manufacturing process can be increased because the slimming is unnecessary and the etching can be performed continuously. Thereby, the manufacturing cost of the semiconductor memory device can be reduced.

Also, as shown in FIG. 3A, the multiple terrace regions RS are arranged in one column along the L-direction in the exposure mask 100; and the pattern having the period P1 that is shorter than the resolution limit is formed in the region A1 of each of the terrace regions RS. Also, the duty ratio D of the region A1 in each of the terrace regions RS is changed in steps according to the arrangement order of the terrace regions RS. Thereby, when performing the exposure of the resist film 41 using the exposure mask 100, the light amount irradiated on the resist film 41 can be changed in steps every terrace region RS without resolving the pattern of the region A1 on the upper surface of the resist film 41. As a result, the resist mask 42 having the stairstep configuration can be formed.

Further, the transparent portion 101 and the light-shielding portion 102 are provided at one location each at the period P2 that is longer than the resolution limit in the region A2 of each of the terrace regions RS of the exposure mask 100. Thereby, the transparent portion 101 and the light-shielding portion 102 are somewhat resolved at the upper surface of the resist film 41; and the steep ramp 44 can be formed in the resist mask 42. As a result, the steep ramp 23 can be formed between the terraces 21 when etching the stacked body 20 using the resist mask 42. Thereby, the surface area of the ramp 23 when viewed from the Z-direction is reduced; and higher integration of the semiconductor memory device 1 can be realized.

Because the transparent portion 101 and the light-shielding portion 102 of the region A2 are somewhat resolved, the protrusion 43a is formed at the tip portion of the terrace 43 of the resist mask 42; and the recess 43b is made at the base portion of the resist mask 42. Because the resist film 41 is the positive type, the protrusion 43a is caused by the minimum portion 105 of the intensity distribution of the light shown in FIG. 3B; and the recess 43b is caused by the maximum portion 106. Then, the protrusion 21a and the recess 21b are made by the protrusion 43a and the recess 43b of the resist mask 42 being transferred onto the stacked body 20.

Furthermore, in the exposure mask 100, the terrace regions RS are arranged only in the L-direction and are not arranged in the W-direction. Therefore, in the W-direction, the terrace region RS is not disposed between the transparent region RT and the light-shielding region RB; and the two regions contact each other. Thereby, as shown in FIG. 1A to FIG. 1C, only the two X-direction end portions of the stacked body 20 are patterned into stairstep configurations; and the two Y-direction end portions can be set to be the steep side surfaces 22. As described above, although the terraces 21 formed at the two X-direction end portions 20b of the stacked body 20 are regions utilized to connect the contacts 27 to the conductive films 14, if terraces are formed at the two Y-direction end portions of the stacked body 20, such space is not utilized and is dead space. In the embodiment, by not patterning the two Y-direction end portions of the stacked body 20 into stairstep configurations, the dead space is reduced; and higher integration of the semiconductor memory device 1 can be realized. According to the manufacturing method according to the embodiment, when patterning the stacked body 20, the distance dy can be set to be not more than ½ times the distance dx; if the etching conditions are selected appropriately, the distance dy can be set to be not more than 1/10 times the distance dx; and according to the conditions, the distance dy can be set to be substantially zero.

Actually, in the reverse order of the description described above, the exposure mask 100 is designed to match the configuration of the stacked body 20 to be ultimately formed.

Figure 9:
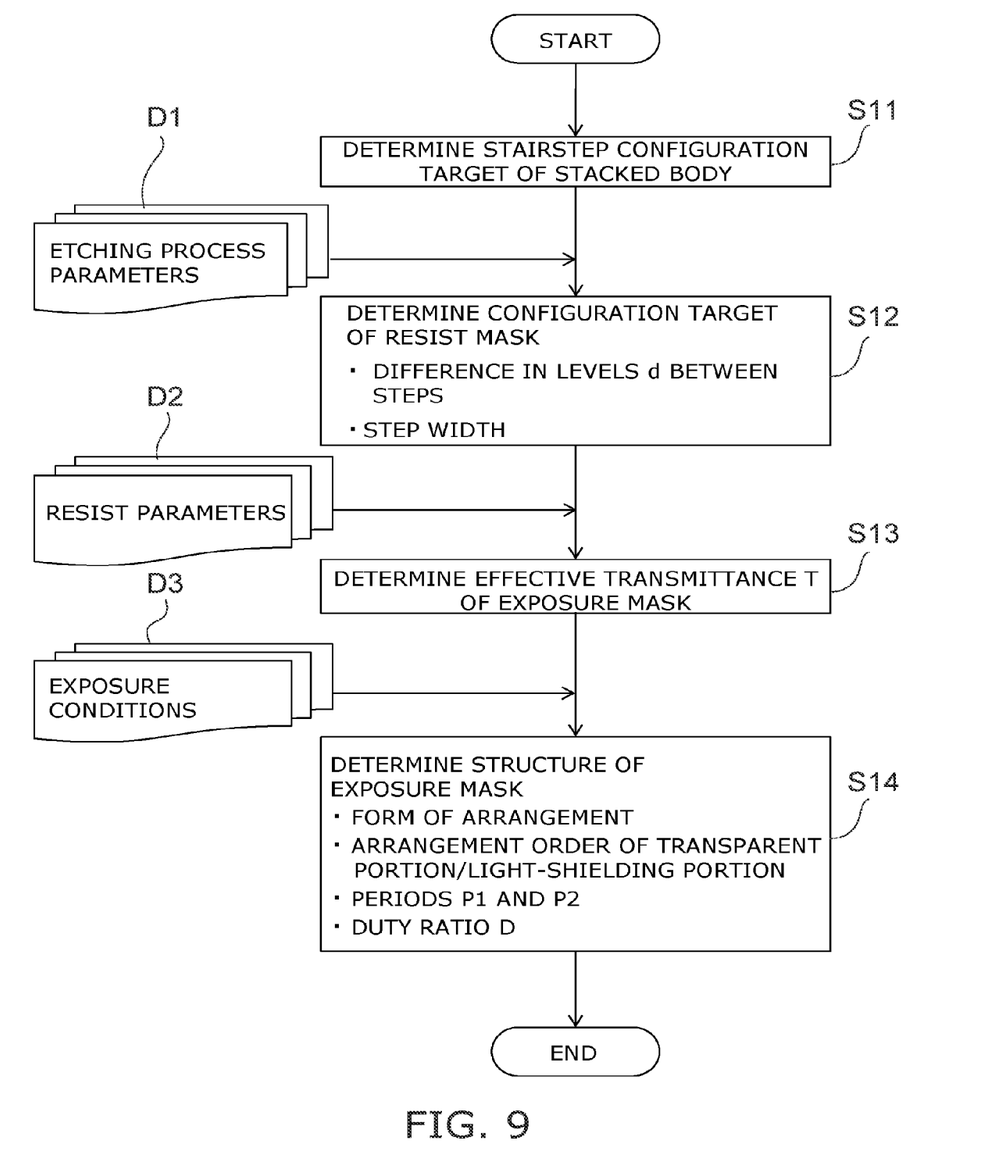
FIG. 9 is a flowchart showing a method for designing the exposure mask of the embodiment.

FIG. 9 is a flowchart showing a method for designing the exposure mask of the embodiment.

First, as shown in step S11 of FIG. 9, the target of the stairstep configuration of the stacked body 20 is determined based on the performance, design rules, etc., necessary for the semiconductor memory device 1 to be manufactured. The target of the stairstep configuration of the stacked body 20 includes the number of levels of the terraces 21, the width of each of the terraces 21, the difference in levels d between the terraces 21, the tilt angle θ of the ramp 23, etc.

Then, as shown in step S12, the configuration target of the resist mask 42 is determined based on etching process parameters D1. The etching process parameters D1 include the etching ratio α, etc., described above. The configuration target of the resist mask 42 includes the width, the difference in levels (α×d) between the terraces 43, etc.

Then, as shown in step S13, the effective transmittance T of each of the regions A1 of the exposure mask 100 is determined based on resist parameters D2. The resist parameters D2 include information of whether the resist is the positive type or the negative type, the photosensitivity ratio, etc.

Then, as shown in step S14, the structure of the exposure mask 100 is determined based on exposure conditions D3. The exposure conditions D3 include the frequency λ of the light used in the exposure, the numerical aperture NA of the optical system, the radius (the coherence factor) σ of the illumination, etc. The structure of the exposure mask 100 includes the form of the arrangement of the transparent portion 101 and the light-shielding portion 102, the arrangement order of the transparent portion 101 and the light-shielding portion 102, the arrangement periods P1 and P2 of the transparent portion 101 and the light-shielding portion 102, the duty ratio D of each of the terrace regions, etc. For example, other than a line-and-space configuration such as that shown in FIG. 3A, an arrangement having a dot configuration may be considered for the form of the arrangement. For example, the structure of the exposure mask 100 is determined by a simulation including Formula 2 and Formula 3 recited above.

Thus, the specific configuration of the exposure mask 100 is determined.

Test Example

A test example will now be described.

Figure 10A:
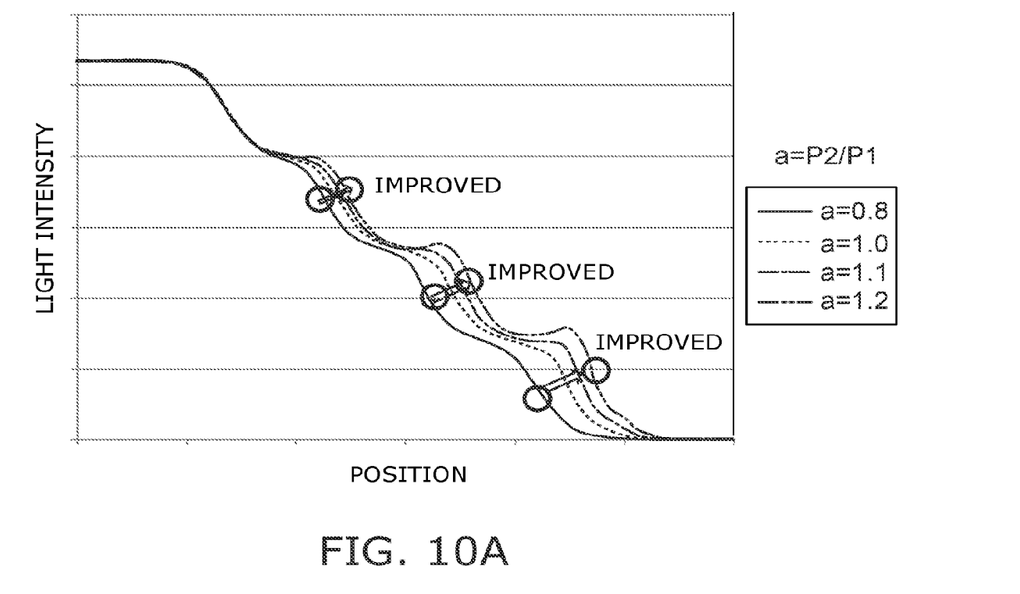
FIG. 10A is a graph showing simulation results of the intensity distribution of the light, where the horizontal axis is the position, and the vertical axis is the intensity of the light.
Figure 10B:
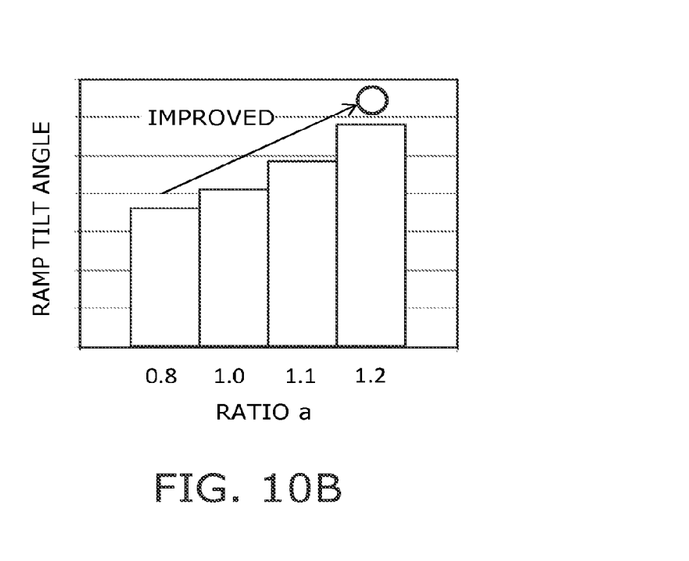
FIG. 10B is a graph showing the effects of the ratio a on the tilt of the ramp, where the horizontal axis is the ratio a of the period P2 to the period P1, and the vertical axis is the tilt angle of the ramp portion of the intensity distribution of the light.

FIG. 10A is a graph showing simulation results of the intensity distribution of the light at the imaging plane in the case where the period P2 is changed with respect to the period P1 for the region A2 of the exposure mask, where the horizontal axis is the position, and the vertical axis is the intensity of the light; and FIG. 10B is a graph showing the effects of the ratio a on the tilt of the ramp, where the horizontal axis is the ratio a of the period P2 to the period P1, and the vertical axis is the tilt angle of the ramp portion of the intensity distribution of the light.

In the test example, the exposure mask shown in FIG. 3A, i.e., an exposure mask in which n is 3, was assumed; the period P2 of the region A2 was changed; and the intensity distribution of the light at the imaging plane was simulated.

As shown in FIG. 10A and FIG. 10B, the tilt of the ramp was steeper as the ratio a was increased in the range of 0.8 to 1.2.

According to the embodiments described above, a semiconductor memory device having high productivity and a method for manufacturing the semiconductor memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A microstructure body, comprising:
    a stacked body including a plurality of unit structure bodies stacked periodically along a first direction;
    a configuration of an end portion of the stacked body in a second direction being a stairstep configuration including terraces formed every unit structure body, the second direction intersecting the first direction; and
    a protrusion being made at a tip portion of an upper surface of the terrace, the protrusion facing to the first direction, and a recess being made at a base portion of the upper surface of the terrace, the recess facing to the first direction.

2. A method for manufacturing a microstructure body, comprising:
    forming a resist film on a stacked body including a plurality of unit structure bodies stacked periodically along a first direction;
    exposing the resist film using an exposure mask, a plurality of terrace regions arranged along one direction being set in the exposure mask, a first region and a second region arranged along the one direction being set in each of the terrace regions, a light-shielding portion and a transparent portion being arranged at a first period in the first region, the light-shielding portion and the transparent portion being arranged at a second period in the second region, the second period being longer than the first period, a surface area ratio of the light-shielding portion and the transparent portion in the first region of the plurality of terrace regions changing in steps according to an arrangement order of the terrace regions;
    forming a resist mask by developing the resist film after the exposing; and
    patterning the stacked body by etching using the resist mask as a mask.

3. The method for manufacturing the microstructure body according to claim 2, wherein the first period is shorter than a resolution limit of the exposing, and the second period is longer than the resolution limit.

4. The method for manufacturing the microstructure body according to claim 2, wherein the first period is 1/n times (n being an integer not less than 1) a length of the first region in the one direction.

5. The method for manufacturing the microstructure body according to claim 2, wherein one of the light-shielding portions and one of the transparent portions are provided in the second region.

6. The method for manufacturing the microstructure body according to claim 2, wherein
the one direction corresponds to a second direction, and the second direction intersects the first direction in an optical system of the exposing, and
a configuration of an end portion of the resist mask on the second-direction side is a stairstep configuration including a plurality of terraces formed to correspond to the plurality of terrace regions.

7. The method for manufacturing the microstructure body according to claim 6, wherein a protrusion is made at a tip portion of an upper surface of the terrace of the resist mask, and a recess is made at a base portion of the upper surface of the terrace of the resist mask.

8. The method for manufacturing the microstructure body according to claim 6, wherein a ramp between the terraces of the resist mask is tilted 45 degrees or more with respect to an upper surface of the terraces.

9. The method for manufacturing the microstructure body according to claim 6, wherein a height between the terraces of the resist mask is set in the etching to be $\alpha$ times a height of one of the unit structure bodies when an etching rate of the resist film is $\alpha$ times an etching rate of the stacked body.

10. The method for manufacturing the microstructure body according to claim 2, further comprising:
forming the stacked body by stacking a conductive film and an insulating film alternately along the first direction;
dividing each of the conductive films into a plurality of first interconnects extending in a second direction intersecting the first direction; and
forming a semiconductor pillar and a memory film, the semiconductor pillar extending in the first direction and piercing the stacked body, the memory film being provided between the semiconductor pillar and the first interconnect.

11. A microstructure body, comprising:
a substrate; and
a stacked body provided on the substrate, the substrate and the stacked body being arranged in a first direction, the stacked body including a plurality of unit structure bodies stacked periodically along the first direction,
a configuration of an end portion of the stacked body in a second direction being a stairstep configuration including terraces formed every unit structure body, the second direction intersecting the first direction,
a first distance between the substrate and a first point of an upper surface of one of the terraces being the longest among distances between the substrate and the upper surface, and a second distance between the substrate and a second point of the upper surface of the one of the terraces being the shortest among the distances between the substrate and the upper surface, the first point being located at a tip side in the upper surface, the second point being located at a base side of the upper surface.

12. The microstructure body according to claim 11, wherein a third distance in a third direction between end edges of two of the unit structure bodies facing the third direction being shorter than a fourth distance in the second direction between end edges of the two of the unit structure bodies facing the second direction, the third direction intersecting both the first direction and the second direction.

13. The microstructure body according to claim 11, wherein the third distance is not more than half of the fourth distance.

14. The microstructure body according to claim 11, wherein terraces are not formed at an end portion of the stacked body in the third direction.

15. The microstructure body according to claim 11, wherein a recess facing to the first direction is made at a base portion of the upper surface of the terrace.

16. The microstructure body according to claim 15, wherein a protrusion facing to the first direction is formed at a tip portion of the upper surface of the terrace.

17. The microstructure body according to claim 11, wherein a ramp between the mutually-adjacent terraces is tilted 45 degrees or more with respect to the upper surface of the terrace.

18. The microstructure body according to claim 11, wherein a side surface of the stacked body facing the third direction is substantially perpendicular to an upper surface of the substrate.

19. The microstructure body according to claim 11, further comprising:
a semiconductor pillar extending in the first direction and piercing the stacked body;
a memory film; and
a second interconnect connected to an upper end of the semiconductor pillar, the second interconnect extending in the third direction,
the unit structure body including
an insulating film, and
a conductive film disposed in the first direction as viewed from the insulating film, the conductive film being divided into a plurality of first interconnects extending in the second direction,
at least a portion of the memory film being disposed between the semiconductor pillar and the first interconnect.

20. The microstructure body according to claim 19, further comprising:
a third interconnect disposed on the stacked body, the third interconnect extending in the second direction; and
a contact, a lower end of the contact being connected to an end portion of the terrace of the first interconnect, an upper end of the contact being connected to the third interconnect.

* * * * *